US008504346B1

(12) United States Patent
Kolpekwar et al.

(10) Patent No.: US 8,504,346 B1
(45) Date of Patent: Aug. 6, 2013

(54) METHOD AND MECHANISM FOR PERFORMING MIXED-SIGNAL SIMULATION OF ELECTRONIC DESIGNS HAVING COMPLEX DIGITAL SIGNAL TYPES OR MODELS

(75) Inventors: Abhijeet Kolpekwar, Round Rock, TX (US); Chandrashekar L. Chetput, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 417 days.

(21) Appl. No.: 12/638,838

(22) Filed: Dec. 15, 2009

(51) Int. Cl.
*G06F 17/50* (2006.01)
*G06F 7/62* (2006.01)
*G06F 9/45* (2006.01)

(52) U.S. Cl.
USPC ................................ 703/14; 703/13; 716/103

(58) Field of Classification Search
USPC ................... 703/14, 13; 716/3, 103
See application file for complete search history.

(56) References Cited

U.S. PATENT DOCUMENTS

| 8,201,137 B1* | 6/2012 | Bhushan et al. | 716/139 |
| 2002/0049576 A1* | 4/2002 | Meyer | 703/14 |
| 2007/0124706 A1* | 5/2007 | Kolpekwar et al. | 716/1 |

OTHER PUBLICATIONS

Mayiladuthurai, Ramesh et al., "Translating SPICE Models to VHDL-AMS", Oct. 1996, Proceedings of the 1996 Fall VIUF Conference, Raleigh, NC.*

Li, Shenggao et al., "The Implementation of a VHDL-AMS to SPICE Converter", Feb. 15, 1999, Analog Integrated Circuits and Signal Processing, 22.*

Christen, Ernst et al., VHDL-AMS—A Hardware Description Language for Analog and Mixed-Signal Applications, Oct. 1999, IEEE Transactions on Circuits and Systems-II: Analog and Digital Signal Processing, vol. 46, No. 10.*

Rajagopalan, Sreeram et al., "Mixed Level and Mixed Signal Simulation Using Cadence PSpice A/D and VHDL", Jan. 26, 2007, EMA Design.*

Moslehpour, Saeid et al., "Simulating VHDL in PSpice Software", 2008, Springer Science+Business Media B.V.*

Pecheux, Francois et al., "VHDL-AMS and Verilog-AMS as Alternative Hardware Description Languages for Efficient Modeling of Multidiscipline Systems", Feb. 2005, IEEE Transactions on Computer-Aided Design of Integrated Circuits and Systems, vol. 24, No. 2.*

Rhodes, David L. et al., "Analog Modeling Using MHDL", Jan. 30, 2005, Current Issues in Electronic Modeling, Issue 2, Modeling in Analog Design, Kluwer Academic Publishers.*

A. Baguenier et al., "Mixed-Signal Verification using VHDL-Spice", CDNLive! 2009, Silicon Valley, USA, 2009.

\* cited by examiner

*Primary Examiner* — David Silver
*Assistant Examiner* — Cedric D Johnson
(74) *Attorney, Agent, or Firm* — Vista IP Law Group, LLP

(57) ABSTRACT

Disclosed are methods, systems, and structures for implementing an improved approach for simulating mixed-signal electronic designs. An improved approach for providing seamless interaction between analog and digital blocks during simulation, even if the digital blocks include complex types or models.

38 Claims, 24 Drawing Sheets

Fig. 1

```
library ieee;
use    ieee.std_logic_1164.all;
entity supply_source is
       port ( p : real);
end entity supply_source;
architecture a_supply_source of
supply_source is
begin
        p <= 5.0;
end architecture a_supply_source;
```

Fig. 2

```
type my_type is record
    v   : real;    -- driving voltage
    i   : real;    -- driving current
    imp_out : real;    -- series output impendence
    imp_par : real;    -- series parameter impedance;
end record
type my_type_vector is array (natural array <>) of my_type;
function resolve_my_analog ( s: my_type_vector) return my_type;
subtype alg_type is resolve_my_analog my_type;
```

Fig. 3

```
library ieee;
use   ieee.std_logic_1164.all;
entity adv_source is
    port ( p : my_type);
end entity adv_source;
architecture a_adv_source of adv_source is
begin
    p <= (5.0, 0.0, 1.0, 1.0);
end architecture a_adv_source;
```

Fig. 4

```
.subckt my_supply a
V1 a 0 5.0
.ends
```

Fig. 10

```
simulator lang=spectre
Subckt spice_C
r1 resistor p1 0 r=1
Ends Spice_C
```

Fig. 11

```
Modified Spice subckt with CE
simulator lang=spectre
Subckt spice_C
  r1 p1 0 resistor r=1.0
  ce_inst p1 myCE
// This is the additional CE instance that gets the value from
// Digital simulator and passes it onto node p1 in spice.
Ends Spice_C
```

```
Dummy VH-C (VHDL-AMS) cell automatically created by the pre-processor
LIBRARY IEEE;
USE   IEEE.MATH_REAL.ALL;
USE   IEEE.MATH_COMPLEX.ALL;
USE   IEEE.STD_LOGIC_1164.ALL;
USE   IEEE.ELECTRICAL_SYSTEMS.ALL;
LIBRARY CDS_SPICELIB;
USE   CDS_SPICELIB.CDS_SPICESKELETON_LIB.ALL;
LIBRARY my_ad_lib;
ENTITY VH_C IS
    PORT (
        P1 : in STD_LOGIC);
    ATTRIBUTE spiceskeleton OF mult16x16_spice : ENTITY IS "./myckt.scs";
END ENTITY VH_C;
ARCHITECTURE spice_skeleton OF VH_C IS
    ATTRIBUTE spiceskeleton  OF spice_skeleton : ARCHITECTURE IS "./myckt.scs";
    ATTRIBUTE spicename      OF spice_skeleton : ARCHITECTURE IS "Spice_C";
    ATTRIBUTE spicesfversion OF spice_skeleton : ARCHITECTURE IS "2.0";
    TERMINAL A_tempnode_0 : ELECTRICAL;
BEGIN
    -- CE instance that performs the necessary digital-analog conversions
    ce_inst : ENTITY my_ad_lib.std_logic2e PORT MAP (P1, A_tempnode_0);
END ARCHITECTURE spice_skeleton;
```

```
entity REAL2E is
  generic (
    vdelta : real := 1.8/64.0;      -- voltage delta
    tr : real := 1.0e-11;            -- rise time
    tdelay : real := 1.0e-11;        -- delay time of analog output
    rout : real := 200.0);           -- time tolerance of crossing port ( signal Din : in real;       -- input electrical
         terminal Aout : electrical);  -- output logic constant tf : real := tr;

end entity REAL2E;

architecture behavior of REAL2E is quantity VAout across IAout through Aout;   -- output voltage
  quantity Vchange : real := 0.0;    --real register for D wreal to A conversion
  signal Vstate : real := 0.0;       ---real register for D wreal to A conversion begin Vchange == abs(Vstate - Din);

real2ele: process ( Vchange'above(vdelta) )
  begin
    Vstate <= Din;
  end process;

VAout == IAout*rout + Vstate'ramp(tr, tf);
  break on Vstate;

end architecture behavior;
```

METHOD AND MECHANISM FOR PERFORMING MIXED-SIGNAL SIMULATION OF ELECTRONIC DESIGNS HAVING COMPLEX DIGITAL SIGNAL TYPES OR MODELS

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

The invention relates to technology for designing, verifying, and simulating an electronic design, such as the design of an integrated circuit ("IC").

Modern electronic design is typically performed with computer aided design (CAD) tools or electronic design automation (EDA) systems. To design an integrated circuit, a designer first creates high level behavior descriptions of the IC device using a high-level hardware design language (HDL). Common examples of HDLs include Verilog and VHDL. An EDA system typically receives the high level behavior descriptions of the IC device and translates this high-level design language into netlists of various levels of abstraction. Essentially, the process to implement an electronic device begins with functional design and verification (e.g., using RTL (Register Transfer Level)), and then proceeds to physical design and verification.

An important step in the process of designing and constructing integrated circuits is simulation. Indeed, simulation can and should be performed during the design process to ensure that the ultimate goals are achievable and will be realized by the finished product. The exploding demand for high performance electronic products has increased interest in efficient and accurate simulation techniques for integrated circuits. For analog designs, an analog-based simulation approach such as SPICE is commonly used to implement simulation of the design. For digital circuit, equivalent digital simulation is performed.

With a growing complexity of System-On-A-Chip (SOC) designs, performing mixed-signal simulation has become a very critical aspect of design verification process. A mixed-signal design contains analog as well as digital blocks that interact with each other. The analog blocks require continuous time-domain (analog) simulators to compute their behavior while digital blocks rely on discrete time event driven (digital) simulators. A mixed-signal simulator uses both analog and digital simulation paradigms and performs the required inter-domain communication to simulate the interaction between analog and digital blocks. Such inter-domain communication is a very important component for controlling the accuracy and performance of the mixed-signal simulation. Hardware description languages, such as Verilog-AMS and VHDL-AMS, allow for effective modeling and simulation of mixed-signal designs.

In order to gain simulation/verification speed-ups, electronic designers often use complex types or models in the hardware description language to model circuit behavior. VHDL real number models are examples of complex types that may be defined to mimic analog behavior. VHDL real number models use advanced VHDL language that supports signal types that have the accuracy of real numbers and use fast discrete-domain simulation techniques for computation. This provides a good blend of accuracy and performance for simulating mixed-signal/analog functionality to cater the current mixed-signal verification needs. The VHDL language offers flexibility in terms of creating user defined signal type, clubbing multiple values on a single signal connection (commonly called user defined record types), as well as programming approaches to resolve signal interactions. This complex language features can result into a highly complex VHDL real number model that has ability to model typical analog circuit effects. In a typical mixed-signal design, such complex VHDL real number models are needed to be simulated with analog/SPICE level blocks.

Mixing of complex VHDL models/types and SPICE blocks is a very challenging problem with regard to simulation, since there is no language/standard in place today to allow for such interaction. It is noted that conventionally, neither VHDL nor VHDL-AMS allows or permits identification of SPICE blocks/instances. Moreover, the complexity of VHDL signal types complicates the problem further since designers need to worry about how such complex VHDL signals can be made to talk to SPICE blocks. Such VHDL-SPICE interaction problems have posed severe limitations in their use in a mixed-signal verification flow.

The concept of digital-analog interaction exists in AMS modeling languages such as Verilog-AMS. However, the concept of VHDL-SPICE interaction is very different. The VHDL/VHDL-AMS standard languages do not recognize SPICE as a valid construct/language. Also, VHDL is a strictly typed-language that (unlike Verilog-AMS) does not allow direct interaction of digital and analog signals. Moreover, the complexity of VHDL signals and the flexibility it offers to its modelers makes it very challenging to simulate its interaction with SPICE.

Therefore, there is a need for an improved approach for verifying and simulating mixed signal electronic circuits.

SUMMARY

Some embodiments of the present invention provide an improved method and system for implementing an improved approach for simulating mixed-signal electronic designs. According to some embodiments, an improved approach is provided for seamless interaction between analog and digital blocks during simulation, even if the digital blocks include complex types or models in a hardware description language. This provides the ability to integrate VHDL real number models with SPICE for simulation purposes.

Other and additional objects, features, and advantages of the invention are described in the detailed description, figures, and claims.

BRIEF DESCRIPTION OF DRAWINGS

FIGS. 1-3 illustrate example VHDL code.

FIG. 4 illustrates an example SPICE subcircuit.

FIGS. 10-12 show example language definitions for performing mixed-signal simulation according to some embodiments.

FIGS. 21-23 illustrate example CEs.

DETAILED DESCRIPTION

Figure 5:
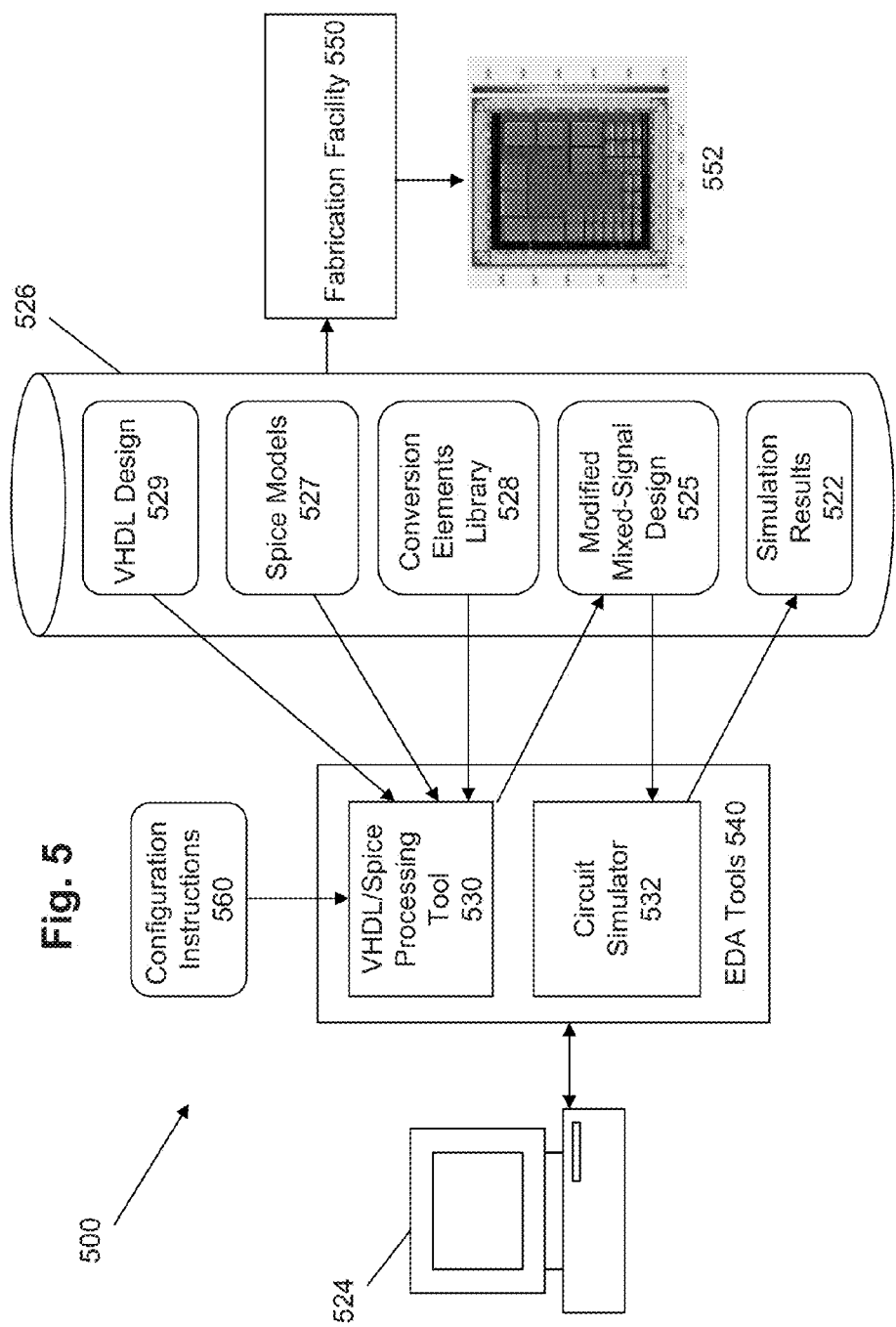
FIG. 5 illustrates a system for performing mixed-signal simulation according to some embodiments.

As noted above, conventional approaches to implementing electronic designs described using hardware description language fail when attempting to perform mixed-signal simulation upon models containing complex digital signals types that interface with an analog block that does not recognize such complex models. Embodiments of the present invention provide an improved method and system for providing seamless interaction between analog and digital blocks during simulation, even if the digital blocks include complex models or types, such as complex real number models.

To explain the invention, illustrative examples and embodiments are provided herein with respect to designs using real number models in the VHDL language that interface with SPICE blocks. It is noted, however, that the invention may be applied to other types of hardware description languages and models/types as well, and therefore is not to be limited to the specific languages and complex types/models in the illustrative examples unless claimed as such.

According to some embodiments, the invention allows designers the flexibility to define and/or program the communications between VHDL and SPICE blocks. Embodiments of the invention also provide advanced techniques to perform analog/digital partitioning of a mixed-signal design written to ensure effective analog-digital communications, e.g., between VHDL real number models and SPICE blocks.

VHDL is a well known hardware description language that offers full flexibility to users to create new signal types, where the new signal type can be of the type records (similar to C-structures) that is capable of holding multiple values/members. VHDL is also capable of creating and associating new resolution function with a signal type. The resolution functions are triggered and evaluated when multiple drivers of a type driver a common set (one or more) receivers.

VHDL is a strictly typed language. In other words, VHDL expects the types of the signal to be defined before it is used. Also, the signals with incompatible types are not allowed to directly connect to each other.

FIG. 1 illustrates a very simple example of a VHDL-D real number model. This example defines a "supply_source" entity having a port/signal "p", where "p" is defined as a real number type. In particular "p" is set at a value of 5.0 to represent a source of 5.0 Volts. This model can be used, for example, to model a simple analog DC source of 5.0 Volts.

VHDL can also be used to establish models of much more complex types. FIG. 2 shows an example of VHDL-D (digital) code which declares a user defined type (e.g., a UDT record) called "my_type". The record type contains multiple data members to model analog parameters such as current, voltages, supply impedances etc. The type "my_type_vector" is a vector form of the UDT record type. The record type may include any combination of member types, including members corresponding to both digital and analog parameters.

The user defined function "resolve_my_analog" is declared which is used when the multiple VHDL-D signals of the type "my_type" drives a common set of receivers. This function is fully programmable by the user and takes an array of signals (e.g., drivers) as an input and returns a final resolved value as an output.

Using these signal types, one can create an advanced supply source, such as the one shown in FIG. 3. This figure illustrates creation of a voltage source with 5.0 volts and a 1.0 ohm of series impedance.

Figure 4:
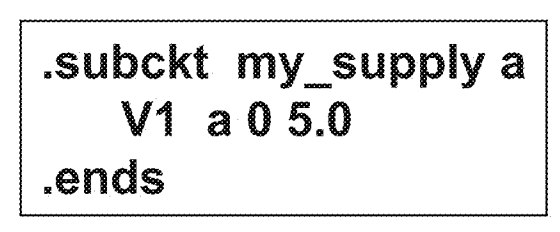

SPICE is a language used for modeling analog circuits, and simulation using SPICE is considered to be a very accurate form of simulation for analog circuits. SPICE level simulation produces continuous time-domain waveforms to indicate the circuit functionality. SPICE uses Kirchhoff's current and voltage laws on the circuit and relies of complex matrix computations to solve the circuit equations. There are various forms/derivatives of SPICE languages currently available in the market, such as Spectre and HSPICE, etc. FIG. 4 shows a very simple example of a SPICE subcircuit block for creating a voltage source of 5.0 Volts.

However, the SPICE language does not allow for user defined types or records, such as those described in FIGS. 1-2. Instead, SPICE only allows for scalar analog nodes that correspond to the circuit nodes. Therefore, it is not possible using conventional techniques to directly interface the VHDL real number models shown in FIGS. 1 and 2 with the SPICE block shown in FIG. 4.

With the simple real number model as shown in FIG. 1, a manually created translator can be employed to translate the signal values between the VHDL model and the SPICE block. However, there are no known translators that can handle the complex real number models such as that shown in FIG. 2. In addition, since VHDL allows the complex models to include extensive variations in types, any manual process that may be undertaken by a designer to created translation routines for the complex real number models would require overwhelming effort by a designer in a process that would be fraught with uncertainties and possible errors.

Embodiments of the present invention provide a framework for efficiently and effectively allowing a complex type and model in VHDL to automatically interface with SPICE. FIG. 5 illustrates an example system 500 which may be employed in some embodiments of the invention for simulating power aware electronic designs. System 500 may include one or more users at one or more user stations 524 that operate the system 500. Such users include, for example, design, test, or verification engineers. User station 524 comprises any type of computing station that may be used to operate, interface with, or implement EDA applications or devices. Examples of such user stations 524 include for example, workstations, personal computers, or remote computing terminals. User station 524 comprises a display device, such as a display monitor, for displaying processing results 522 to users at the user station 524. User station 524 also comprises input devices for user to provide operational control over the activities of system 500.

EDA tools 540 may be used by users at user station 524 to design and verify/simulate a mixed-signal electronic design that is implemented using both complex VHDL types/models 529 and a SPICE models 527. For example, VHDL types/models 529 may be implemented as complex VHDL real number models. The mixed-signal electronic design is a design that includes both digital and analog portions that interact with each other.

A VHDL/SPICE processing tool 530 is employed to automatically process the VHDL model 529 and SPICE model 527 so that simulation can be performed by circuit simulator 532, which includes both a digital simulator and an analog simulator. The VHDL/SPICE processing tool 530 is operative to support direct interaction between VHDL-D and SPICE blocks as well as supporting interaction of complex VHDL-D signals and SPICE blocks. Static analysis can be performed of the mixed-signal design described using VHDL 529 and SPICE 527.

The VHDL/SPICE processing tool 530 uses configuration instructions 560 to generate a modified mixed-signal design 525, where the modified mixed-signal design 525 is simulated by the circuit simulator 532. The VHDL/SPICE processing tool 530 utilizes conversion elements (CE) from a conversion elements library 528 to generate the modified mixed-signal design 525. The concept of VHDL conversion elements allows for effective communication between VHDL-D and SPICE signals. The present embodiment utilizes the configuration instructions 560, which may be in the form of a configuration file, to control selection and evaluation of CE to obtain the optimal simulation results. The VHDL/SPICE processing tool 530 can also perform auto-partitioning of signals/blocks to optimize the number of CE and insure accurate resolution of VHDL signals and inter-conversion of VHDL-D and SPICE signals.

A computer readable storage device 526 may be used to hold any of the VHDL code 529, SPICE models 527, conversion elements library 528, modified mixed-signal design 525, and/or simulation results 522. The computer readable storage device 526 comprises any combination of hardware and software that allows for ready access to the data that is located at the computer readable storage device 526. For example, computer readable storage device 526 could be implemented as computer memory operatively managed by an operating system. The computer readable storage device 526 could also be implemented as an electronic database system having storage on persistent and/or non-persistent storage.

The final electronic design is utilized by a fabrication facility 550 to manufacture electronic products, such as an IC product 552. In particular, in some approaches, the final electronic design is used to generate one or more masks which are used in an opto-lithography process by fabrication facility 550 to lithographically create the layers of shapes and materials that form IC 552.

Prior to manufacturing by the fabrication facility 550, an important step in the electronic design process is to verify that the mixed-signal electronic design is correctly implemented and that it will operate as intended. One approach for performing such verification is to perform simulation upon the design using circuit simulator 532.

As indicated earlier, VHDL is a strongly typed language that does not allow for incompatible signal types to be connected to each other. By definition, SPICE is an analog block. Thus, a direct connectivity of a VHDL digital signal to SPICE block creates a problem for mixed-signal simulators, such as simulator 532.

In a mixed-signal simulation, there are two simulation paradigms at work. One is digital (e.g., discrete event-driven) simulation paradigm and the other is analog (e.g., continuous time-domain) simulation paradigm. The digital simulator computes the digital portion of the mixed-signal design while analog simulator computes the analog/SPICE portion of the design. The mixed-signal simulator is also responsible for computing the necessary analog-digital interactions (e.g., event/value sensitivities etc.) to help provide accurate analysis of mixed-signal effects.

Embodiments of the invention operate by processing the SPICE block and creating a dual identity for it—one for digital simulator and the other for analog simulator. The dual nature satisfies the requirements of the two simulation paradigms as well as the requirements of the VHDL semantics.

Figure 6:
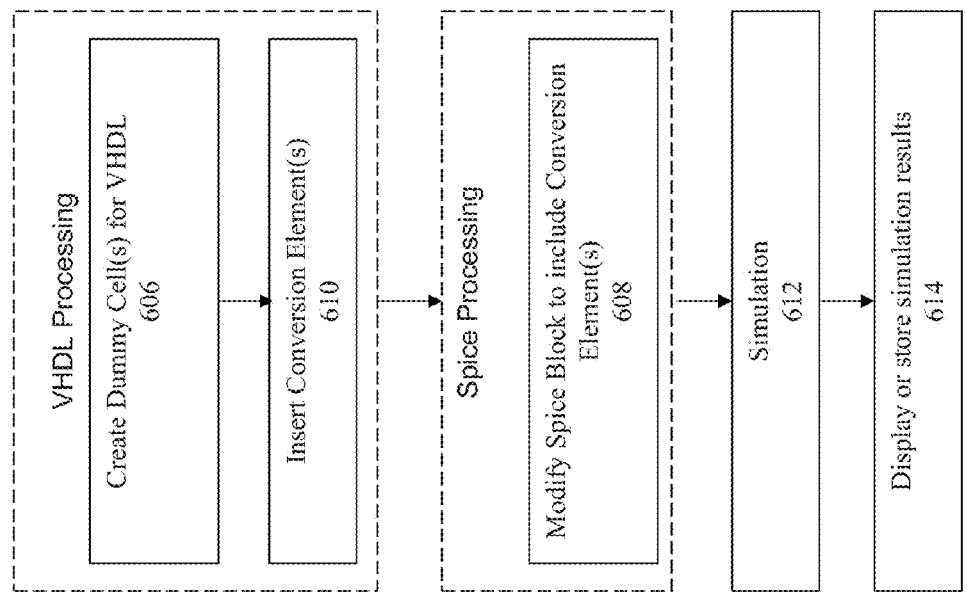
FIG. 6 illustrates a process flow for performing mixed-signal simulation according to some embodiments.

FIG. 6 shows a flowchart of a process for directly connecting VHDL signals from a complex real number model to a SPICE block according to some embodiments of the invention. For VHDL processing, at 606, the design is processed to create a dummy VHDL-D cell for every SPICE block that interacts with a VHDL block in the design. The dummy VHDL-D cell has an interface that contains signal types compatible to the connected VHDL-D signals.

The dummy VHDL-D cell is created, at 610, with the necessary conversion elements instances to convert the VHDL-D interface to the corresponding analog values. The conversion elements may be auto-created using the interface information and user-supplied configuration information.

For SPICE processing, at 608, the SPICE block is modified to include appropriate conversion elements to compute the analog portion of the design.

At 612, simulation is performed, where a digital simulator simulates the modified digital portion of the design while an analog simulator simulates the modified SPICE level of the design. The simulation results can be, at 614, displayed on a display device or stored in a computer readable hardware medium.

According to some embodiments, insertion of CE always occurs inside of a dummy VHDL cell and the corresponding SPICE cell. The CE portions are not inserted into the original VHDL-D cells. This approach avoids the need for any manual changes by the users in the original VHDL-D cells. This is an important feature as it keeps the original user written design unchanged and performs processing internally/automatically on the dummy VHDL-D cells.

Figure 7:
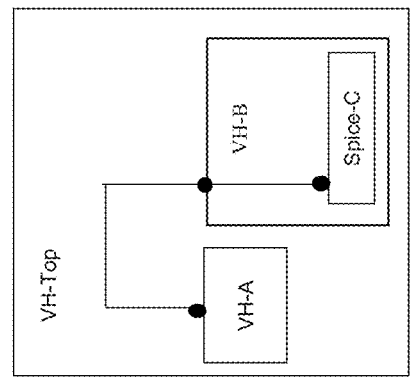
FIGS. 7-9 shows example circuit blocks based upon the process flow for performing mixed-signal simulation according to some embodiments.

To illustrate this process, consider the example user design shown in FIG. 7. This example shows a top-level VHDL block "VH-Top" which includes two VHDL blocks "VH-A" and "VH-B". A SPICE block "Spice-C" exists within VHDL block "VH-B". In this example, a direct connection exists for the VHDL digital signals to SPICE block "Spice-C". Such direct connections from digital to analog (SPICE in this case) are disallowed by the language semantics. However, this is a very typical scenario in the real world where users often create/configure mixed-signal designs using various analog and digital blocks.

Figure 8:
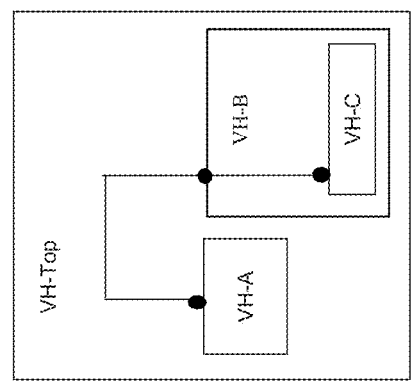

FIG. 8 shows the modification for the VHDL blocks to create a modified circuit image for the digital simulator. In particular, the SPICE cell is replaced with a dummy VHDL cell ("VH-C") for the digital simulator. This maintains the interfaces, connectivity, and compatibility between Blocks "VH-B" and "VH-C". VH-C is created automatically and contains the required CE to perform digital-analog conversions.

Figure 9:
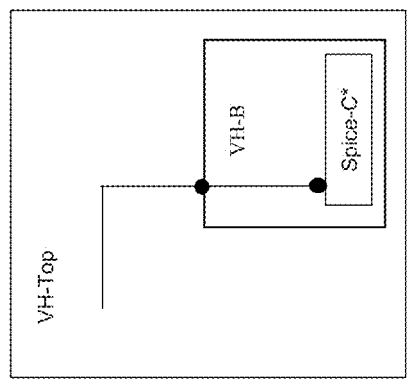

FIG. 9 shows the modification for the SPICE block to create a modified SPICE block for simulation by the analog simulator. The digital portion of the design is removed and only the connectivity information is maintained as well as the SPICE block. The SPICE block used here contains the necessary CE to perform analog-digital conversion.

FIG. 10 shows an example of a SPICE block that creates a very simple resistor definition. FIG. 11 shows an example of how the SPICE block of FIG. 10 can be modified to include a definition 1102 for a CE instance. In particular, the text "ce_inst p1 myCE" provides a definition for a CE instance that obtains its value from the digital simulator to be input to the node p1 in the SPICE block.

FIG. 12 shows an example of a dummy VHDL block VH-C. Conversion element definition 1202 is inserted into the dummy VH-C to instantiate the appropriate conversion element. In particular, the text "ce_inst:ENTITY my_ad_lib.std_logic2e PORT MAP (P1, A_tempnode_0);" defines a CE instance to convert a digital signal P1 to analog A-tempnode_0. The purpose of the dummy VHDL block is to provide information on the required analog-digital information exchange by instantiating appropriate CEs, maintain the design hierarchy information, and preserve the interface (i.e. port types and directions) of the original VHDL digital block that is being replaced. It should be noted that the dummy VHDL block can also be created by using interface information (e.g., port type and direction) from the configuration file. There does not necessarily need to be an original VHDL digital block replacement.

In addition to the CE instances, the dummy VHDL block also contains other instances that are a part of the original VHDL block. This is to preserve the original design hierarchy even with dummy VHDL block. FIG. 12 shows an example of a dummy VHDL block VH-C with conversion element definition 1202 instantiated in dummy VH-C based on the port types and directions at the dummy VHDL block interface. In particular, the text "ce_inst:ENTITY my_ad_lib.std_logic2e PORT MAP (P1, A_tempnode_0);" defines a CE to convert a digital signal P1 to analog A-tempnode_0.

The selection of this conversion element is based on the instructions given in the configuration file. The dummy cell also contains a set of attributes that provide information around the corresponding SPICE subckt. These attributes and the dummy VHDL cell information are used to generate the corresponding modified SPICE sub-circuit definition. The interface information (port type and direction) of the VHDL dummy cell also provides input to determine the type of conversion elements that is needed.

Figure 13:
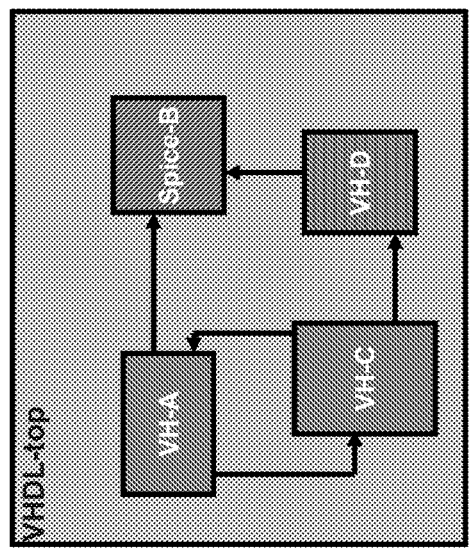
FIGS. 13-14 illustrate example situations for applications of embodiments of the invention.
Figure 14:
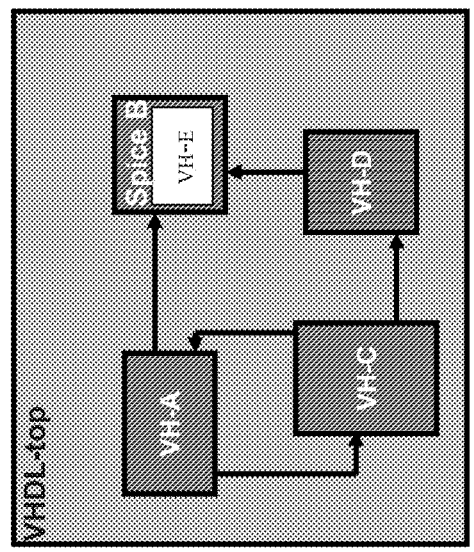

The present invention can be applied regardless of the hierarchical position of the SPICE block. For example, FIG. 13 shows an example of a SPICE block on leaf, in which the VHDL block is at the top. Block Spice-B is a SPICE block and is instantiated in the VHDL scope. There are direct signal connections from the VHDL blocks to the SPICE block Spice-B and vice-versa. FIG. 14 shows an example of the VHDL-SPICE in the middle. This figure also shows the VHDL block is at the top. The block Spice-B is SPICE and is instantiated in VHDL scope. Here, there are also direct signal connections from VHDL blocks to SPICE and vice-versa. However, the SPICE block Spice-B further instantiates a VHDL block E. In either case, the above-described process can be employed to create a dummy VHDL block and a modified SPICE block to perform the necessary interactions to allow simulation to occur.

As discussed earlier, configuration information can be used to define the selection and programming of the conversion elements. The following is an example of syntax that can be used within a configuration file for this configuration information:

CE [name=lib.entity:architecture] [type=vhdl_ signal_type] [dir=in/out/inout] [cell=cell name] [inst= hierarchical instance name] [genericmap=" . . . "] [cellport= . . . ] [excludeport= . . . ] [priority=high/low] [optimize=on|off] [supply_node= . . . ]

The "name" parameter corresponds to the name of a VHDL-AMS architecture that acts as a Conversion Element. This can be uniquely determined by a library, entity, and an architecture name. The actual definition of the Conversion Element needs to be created and can be provided by the designer based on the design requirements. The "type" parameter corresponds to the VHDL digital signal type across which a given CE needs to be inserted. The "dir" parameter identifies the direction of the communication between VHDL and SPICE block that uses this CE. In some embodiments, the default value for this parameter is "in/out". The "cell" parameter includes the name of the SPICE cell that needs to use this CE (e.g. Spice-C in the above illustrative example). The "inst" parameter contains the hierarchical instance name across which the CE is needed. This option can be used for a cell name. The "genericmap" parameter contains a set of generic names and overridden values for the CE. This is used to control the thresholds, accuracy, and/or performance of the CE instance, e.g., for analog-digital communication. The "cellport" parameter contains the name of the port across which the given CE should be inserted. The "excludeport" parameter corresponds to the name of the ports that need to be excluded for a given CE insertion.

As described in more detail below, the "priority" parameter corresponds to the priority level for selection of a given CE. The "optimize" parameter corresponds to a switch to trigger CE optimization process. The "supply_node" parameter corresponds to a SPICE global node that can act as dynamic supply node for a given CE.

As stated above, some embodiments provide for management of performance and accuracy requirements for analog-digital conversions. The "genericmap" parameter can be used for this purpose for generic names and for overriding values for the CE, e.g., to control the thresholds, accuracy, and/or performance of the CE instance. This CE selection mechanism allows selection of different CE types for different pins in the design based on the expected signal activity and performance/accuracy requirements.

For instance, consider if there is a CE inserted on the supply pin of an analog block that is not expected to have too much signal activity. In such a case, a CE selected for the supply pin for the cell does not need to have very tight conversion thresholds, and can therefore be configured with lower thresholds for reduced accuracy but improved performance for analog simulation. On the other hand, if a CE is inserted at a pin with high activity, then a tighter level of tolerances is necessary to catch all the necessary signal activities and convert them onto analog side.

Figure 15:
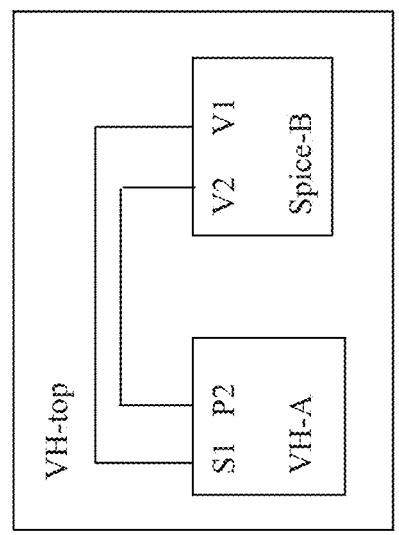
FIG. 15 illustrate different circuit blocks that may correspond to different tolerance levels.

To illustrate, consider the circuit example shown in FIG. 15. Here, supply pin S1 is assumed to correspond to a constant value that does not change very much, and hence does not need to be at a high accuracy level. Further assume that P2 undergoes rapid changes at a high activity level, and hence requires greater levels of accuracy. In this case, the two pins can be identified with different VHDL signal types, such as the following:

type vh_supply is real; —to indicate supply pin
type vh_active is real; —to indicate highly active pin
Declarations in VH-A Block
signal S1: vh_supply;
Signal P2: vh_active;
Declaration that Will be Used in Dummy VH-B Block
Signal V1: vh_supply;
Signal V2: vh_active;

The following are example settings in the configuration file that can be used to perform CE selections, assuming that there is a tolerance generic used in the CE definition that is used to control the analog simulation accuracy:

Ce name=lib1.d2a:supply_arch cell=spice_b cellport=V1 genericmap="tolerance 0.1"
Ce name=lib2.d2a:supply_ative cell=spice_b cellport=V2 genericmap="tolerance 0.00001"//tighter tolerance These two code portions set two different tolerance levels for the V1 and V2 ports. In particular, the V1 port corresponds to the supply voltage, and therefore can be configured with a tolerance (e.g., 0.1) that is much more permissive than the V2 port which corresponds to a much tighter tolerance level (e.g., 0.00001).

Embodiments of the invention can be configured to manage analog-digital interaction for blocks with large number of pins. For modern designs, it is often the case that there are several hundreds of pins for a given design, which can create a very difficult situation for the task of defining a configuration for the conversions. According to some embodiments, the parameters "cellports" and "excludeports" can be used to select or deselect a set of pins. For example, the following CE statement can be used to apply to all ports of spice_H whose name begin with V and excludes pin P1:

Ce name=lib1.d2a:myarch1 cell=spice_H cellport=V* excludeport=P1

The following CE statement can be used to apply to pin P1 of spice_H, only:

Ce name=lib1.d2a:myarch2 cell=spice_H cellport=P1

A combination of above two CE statements allows the users to apply the desired CE to appropriate locations. Wildcard characters may be used to provide more control over multi-pin configurations.

The VHDL language allows a signal type to be created and also allows subtypes to be created from the base signal types. VHDL models can be created to use the base and subtypes to indicate differences in signal functionalities. From the signal compatibility point of view, a signal with a base type is considered compatible with the signal of the derived type. This language feature poses a situation for CE selection where it is desirable in some cases to apply the same CE for base as well as derived types, while in other case, there may be a need to apply a different CE for base and derived type. This may occur, for example, if there are two signals that both drive the same receiver, where the two signals are of different base and derived types.

The parameter "priority" can be provided to determine which (base or derived type) gets the priority for CE selection. By default in some embodiments, if there are two CE that are defined (one for base and one for derived) then the base CE gets a precedence in the case where a base signal type is connected to a derived signal type. If there is a desire to override this, then a "High" priority can be set for the CE of the derived type. This aspect of CE selection is useful for handling a design configuration where the VHDL base and derived signal types are mixed together but both interact with SPICE.

Conversion element optimizations may be performed in some embodiments, which involve performing a static analysis of hierarchical design connectivity to optimize the number of CE required in the design. The CE optimization process is performed to correct and optimize signal resolution computation. Signal resolution refers to a process in which the values from multiple signal drivers are computed to a final resolved value. In VHDL, the resolution function can be, for example, a user defined one. In the presence of SPICE blocks, the resolution function should account for the contribution coming from SPICE blocks and also drive back the correct resolved value back onto SPICE.

To accomplish this optimization, the present embodiment provides for automatic partition of VHDL-D and SPICE blocks such that there are minimal conversion elements that are utilized for a given hierarchical/local net that connects one or more SPICE blocks.

Figure 16:
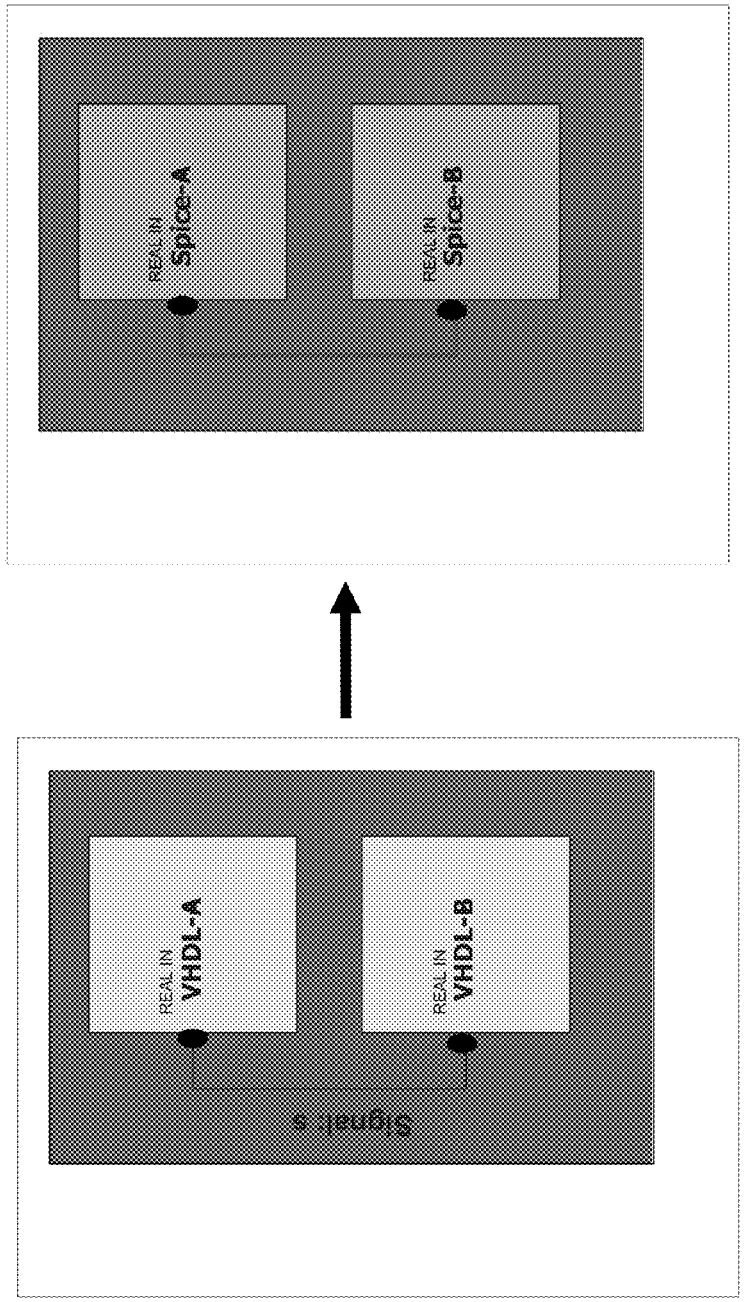
FIGS. 16-19 illustrate various CE (conversion element) optimizations.

FIG. 16 illustrates an example optimization involving local optimization. The left side of the figure shows a pure digital configuration where there is a signal "S" that connects two blocks VHDL-A and VHDL-B. Assume that the two blocks are connected with ports defined to be "Real", and after modifications, corresponds to the SPICE blocks Spice-A and Spice-B shown on the right side of the figure. In this circumstance, the two SPICE blocks are connected to each other through the digital signal "s".

Embodiments of the invention can be used to perform coercion of VHDL signal to analog based on connectivity of the signals. In this embodiment, if a VHDL-D signal operates merely as an interconnect between the 2 SPICE blocks, then the CE optimization process coerces it to become analog. This eliminates the need for any conversion element insertion. Therefore, in the example of FIG. 16, since both blocks are analog in nature, there is no need for a CE since the signal "s" will be converted to analog.

Figure 17:
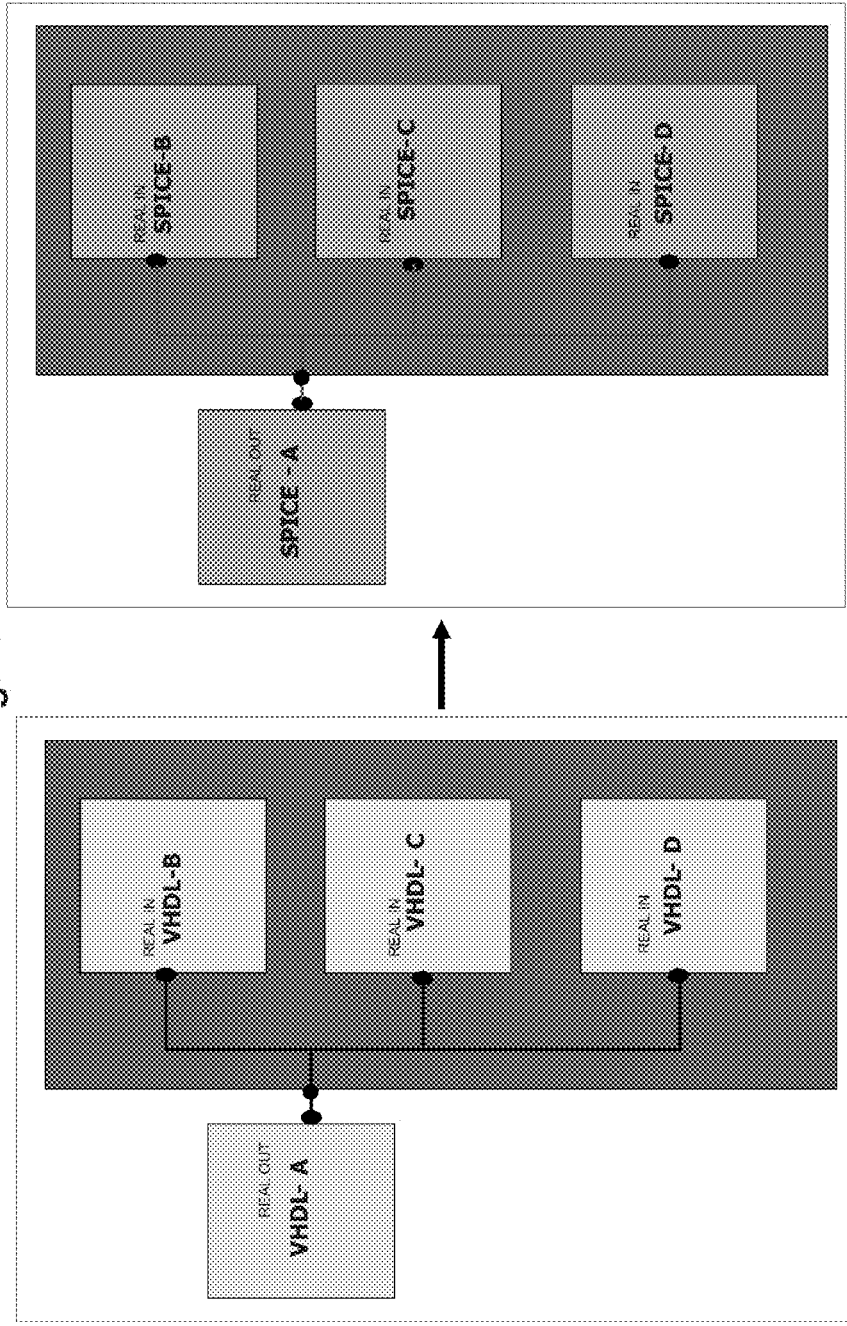

FIG. 17 illustrates an example optimization involving hierarchical optimization. The left side of the figure shows a pure digital configuration where block VHDL-A drives blocks VHDL-B, VHDL-C, and VHDL-D. In this example, after modifications, all blocks will become SPICE blocks as shown on the right side of the figure. As before, the process operates by going up and down the blocks to see if any are digital. In this circumstance of the mixed-signal configuration, no CEs are required since all SPICE blocks are connected to each other without any interactions to VHDL-D connections.

In some cases, having a single CE for a given hierarchical path ensures that the resolution function exercised on the digital portion of the path sees only one SPICE/analog contribution. This helps in accurate modeling of analog-digital interactions.

Figure 18:
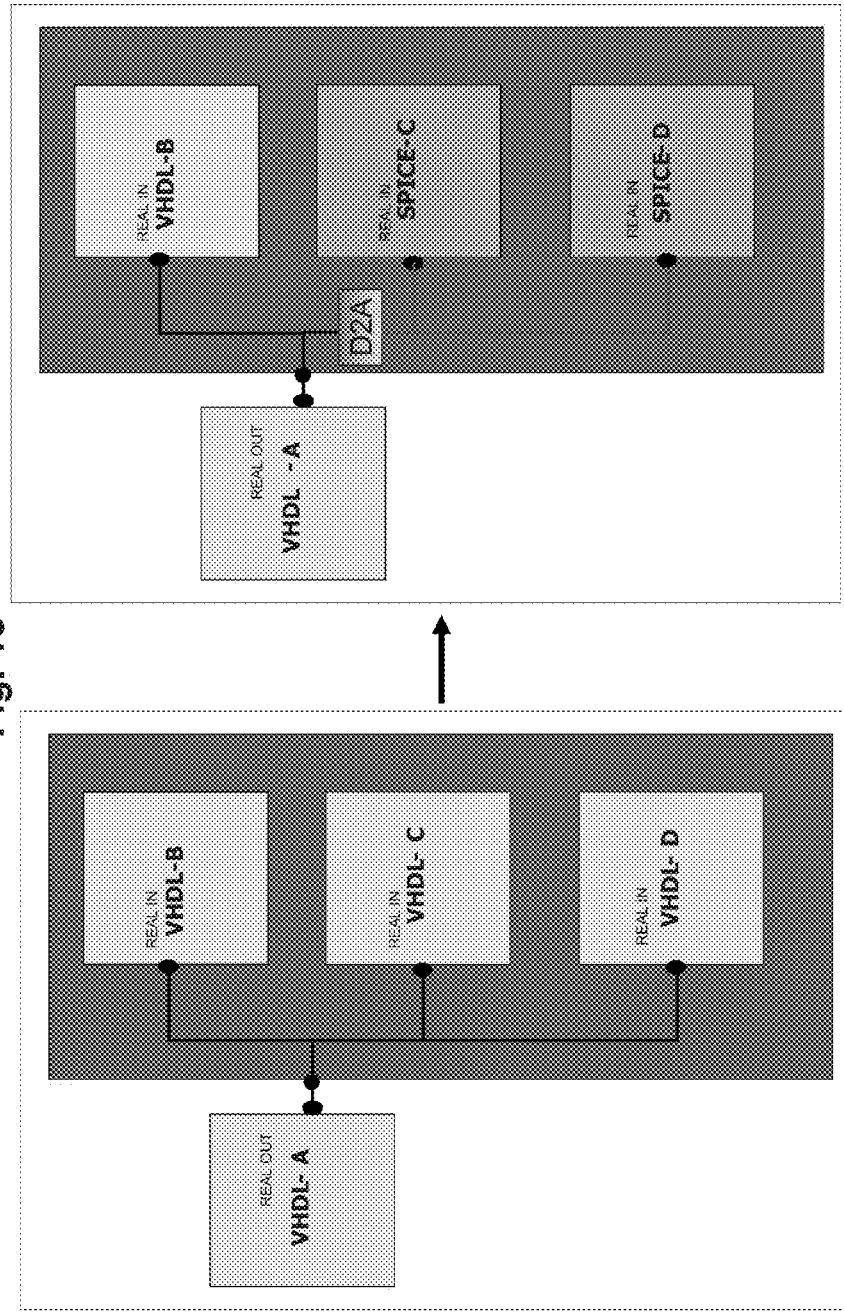

FIG. 18 illustrates an example optimization involving CE selection based on port directions. The left side of the figure shows a pure digital configuration where block VHDL-A drives blocks VHDL-B, VHDL-C, and VHDL-D. Assume that after modifications, blocks C and D become SPICE blocks as shown on the right side of the figure. As before, the process operates by going up and down the blocks to see if any are digital. In this circumstance of the mixed-signal configuration, it can be seen that the blocks VHDL-A and VHDL-B are digital blocks. Therefore, there are both digital and analog block after the modifications. If the port directions of all VHDL blocks that are replaced by SPICE are "IN", then a digital-to-analog (D2A) CE is inserted prior to the Spice-C and Spice-D blocks.

Figure 19:
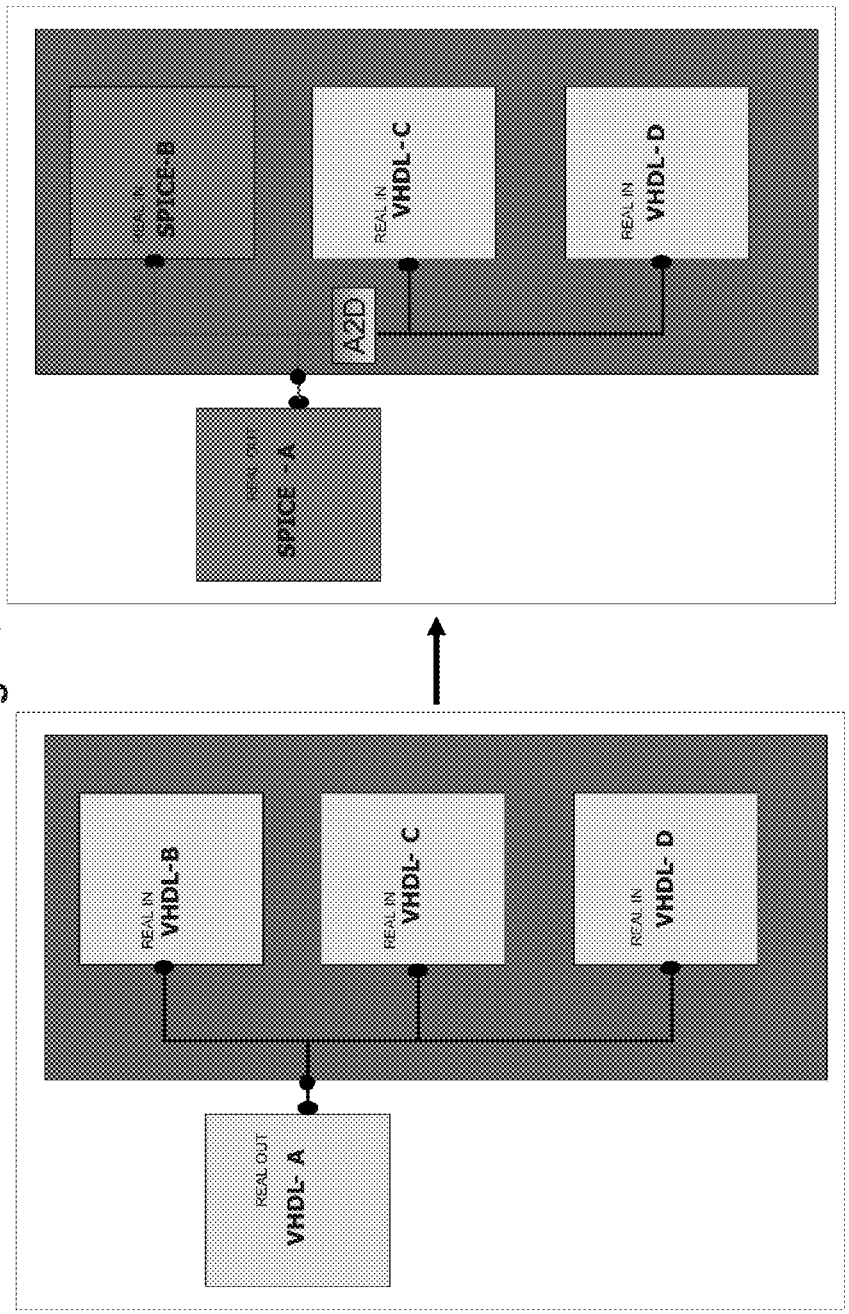

FIG. 19 illustrates another example optimization involving CE selection based on port directions. The left side of the figure shows a pure digital configuration where block VHDL-A drives blocks VHDL-B, VHDL-C, and VHDL-D. Assume that after modifications, blocks A and B become SPICE blocks as shown on the right side of the figure. As before, the process operates by going up and down the blocks to see if any are digital. In this circumstance of the mixed-signal configuration, it can be seen that the blocks VHDL-C and VHDL-D are digital blocks. Therefore, there are both digital and analog block after the modifications where the VHDL blocks that are replaced by SPICE have different port directions. The CE is determined on digital VHDL port directions. In this case, all VHDL-D ports are IN so an analog-to-digital (A2D) CE is inserted prior to the VHDL-C and VHDL-D blocks.

Some embodiments of the invention can be used to address the power supply for the CE. The power-supply value is used in the CE to determine the thresholds for analog-digital conversion. For example, if a power-supply value of a CE is 5.0, then an analog voltage of 5.0 is translated to digital state "1".

According to some embodiments, different power supplies can be defined for the CE based on where in the design they are inserted. In modern IC designs, the different blocks in the design can have different power supply requirements. The configuration file can be used to program the power-sensitivity of the CE based on the where in the design and across which cell/instance they are inserted. For example, if a cell-A in the design needs 5.0 power supply and cell-B needs 3.3, then the following example configurations can be employed:
    ce name=lib.d2a:myarch type=std_logic dir=in cell=cell_A genericmap="vdd 5.0"
    ce name=lib.d2a:myarch type=std_logic dir=in cell=cell_B genericmap="vdd 3.3"

In this example, the first configuration sets Vdd to 5.0 and the second configuration sets Vdd to 3.3., using the "genericmap" parameter.

If two different instances of the same cell need different supply values, then this can be implemented by using instance-based CE specification. For example, instances top.i1.i2 and top.i3.i4 for the cell_A that need different power supplies can be defined as follows:
    ce name=lib.d2a:myarch type=std_logic dir=in inst=top.i1.i2 genericmap="vdd 5.0"
    ce name=lib.d2a:myarch type=std_logic dir=in inst=top.i3.i4 genericmap="vdd 3.3"

According to some embodiments, a dynamic power supply can be defined for the CE. A designer often finds the need for a dedicated power supply that changes values during simulation, such as a piece-wise linear (PWL) source. Embodiments of the invention provide for such power supplies to be defined and associated with the CE.

According to a first approach, a PWL waveform is defined as time-value pairs in the genericmap, and that information is used in the CE definition to model a PWL waveforms for supply as follows:
    ce name=lib.d2a:myarch type=std_logic dir=in cell=cell_A genericmap="vdd (0.0 0.0 1.0e-9 3.3 2.0e-9 5.0)"

According to a second approach, a global SPICE node is associated as a supply node for a given CE, as follows:
    ce name=lib.d2a:myarch type=std_logic dir=in cell=cell_A supply_node=vdd1

Here, "vdd1" represents a global SPICE node. The supply_node option assumes that there is a VHDL-AMS terminal called "supply_terminal" in the CE definition. The solution forces an internal node aliasing between "supply_terminal" in the CE definition with the SPICE "vdd1" global node. This provides a very effective mechanism to designer to "tie" dynamic voltage supplies to CE.

Figure 20:
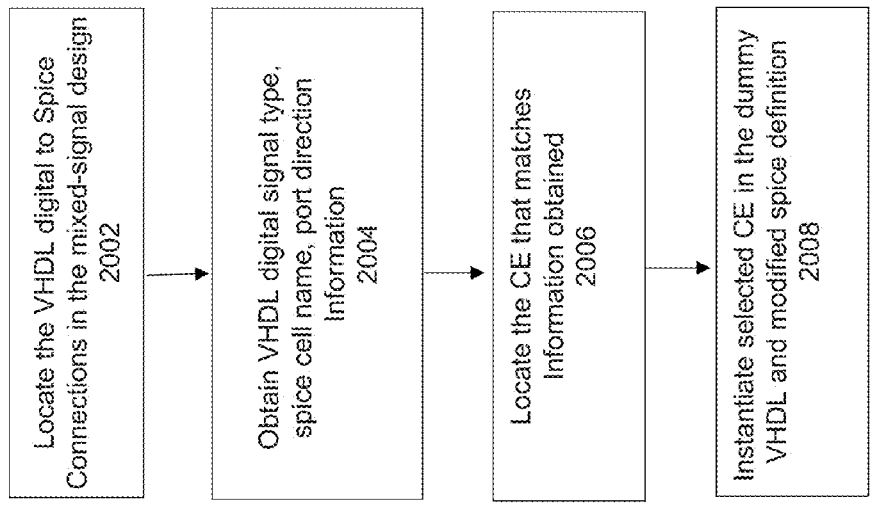
FIG. 20 illustrates a process flow for CE selection and insertion according to some embodiments.

This document will now describe a process flow for performing CE selection and insertion according to some embodiments of the invention. As shown in FIG. 20, the process begins at 2002 to locate the VHDL digital to SPICE connection in the mixed signal design. Next, at 2004, information is collected about the connection and blocks that would be relevant for the CE selection process. For example, such information to be collected includes the VHDL digital signal type, SPICE cell name, and port direction.

At 2006, the CE that matches the information is obtained. As noted above, a library of CEs is maintained to be selected in this step. According to some embodiments, the CEs are written by users and maintained in the CE library. Some CE definitions/libraries can also be provided by tool vendors. Thereafter, at 2008, the selected CE is instantiated in the dummy VHDL and modified SPICE definition.

Figure 21:
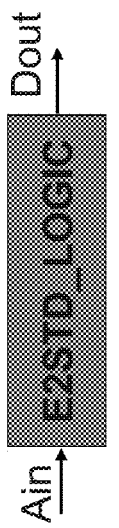
Figure 22:
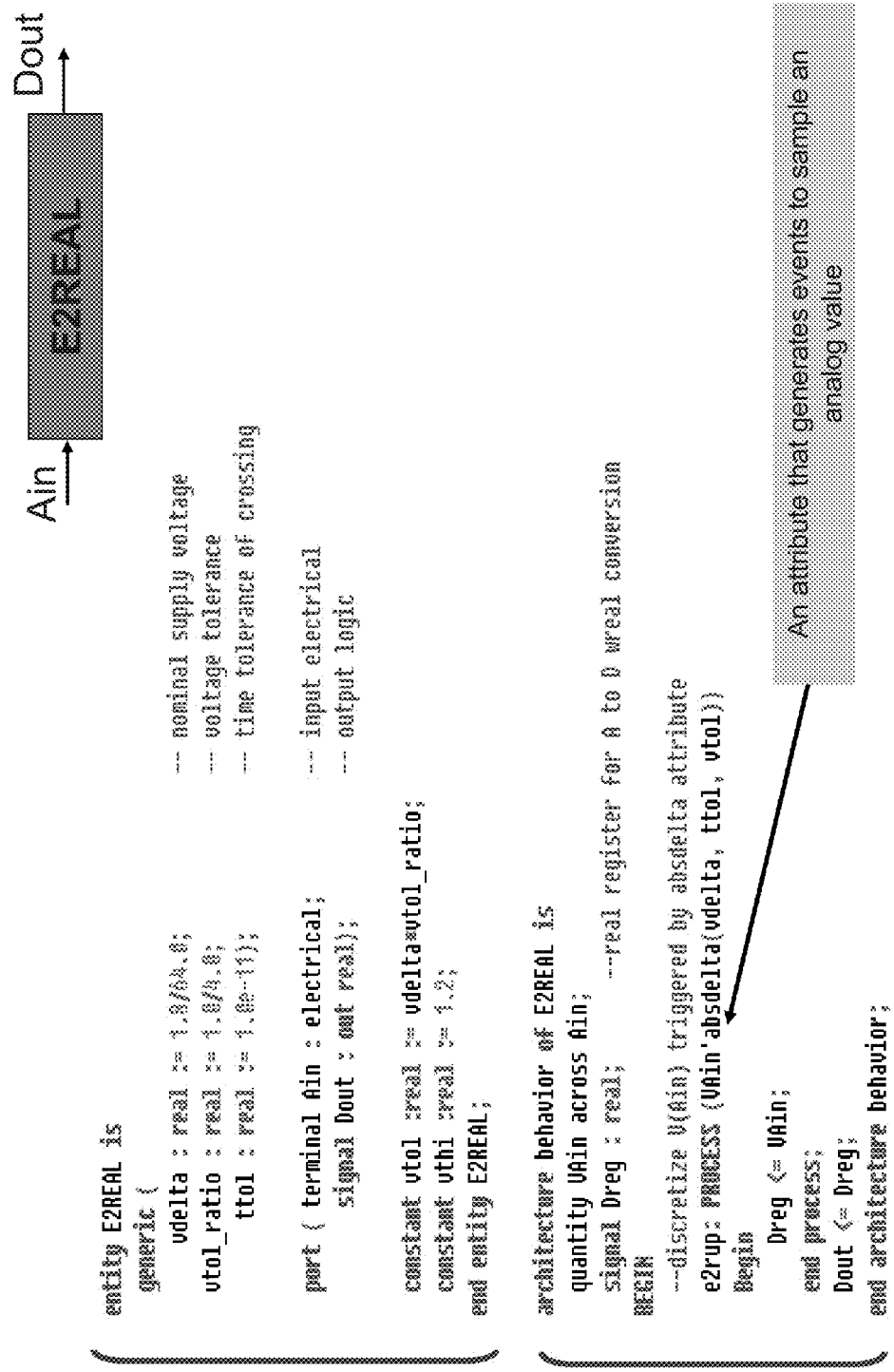

FIGS. 21-23 illustrate example conversion elements. FIG. 21 shows an example CE for performing electrical to digital conversions. FIG. 22 shows an example CE for performing digital to electrical conversions. This example includes an attribute that generates events to sample an analog value when it changes by more than "vdelta" from its previous value but within the given voltage and time tolerances. FIG. 23 shows an example CE for performing real to analog (D2A) conversion. According to some embodiments, the CE definitions are implemented using the architecture and language constructs of VHDL-AMS.

In conclusion, what has been described is an improved approach for providing seamless interaction between analog and digital blocks during simulation, even if the digital blocks include complex real number models.

System Architecture Overview

Figure 24:
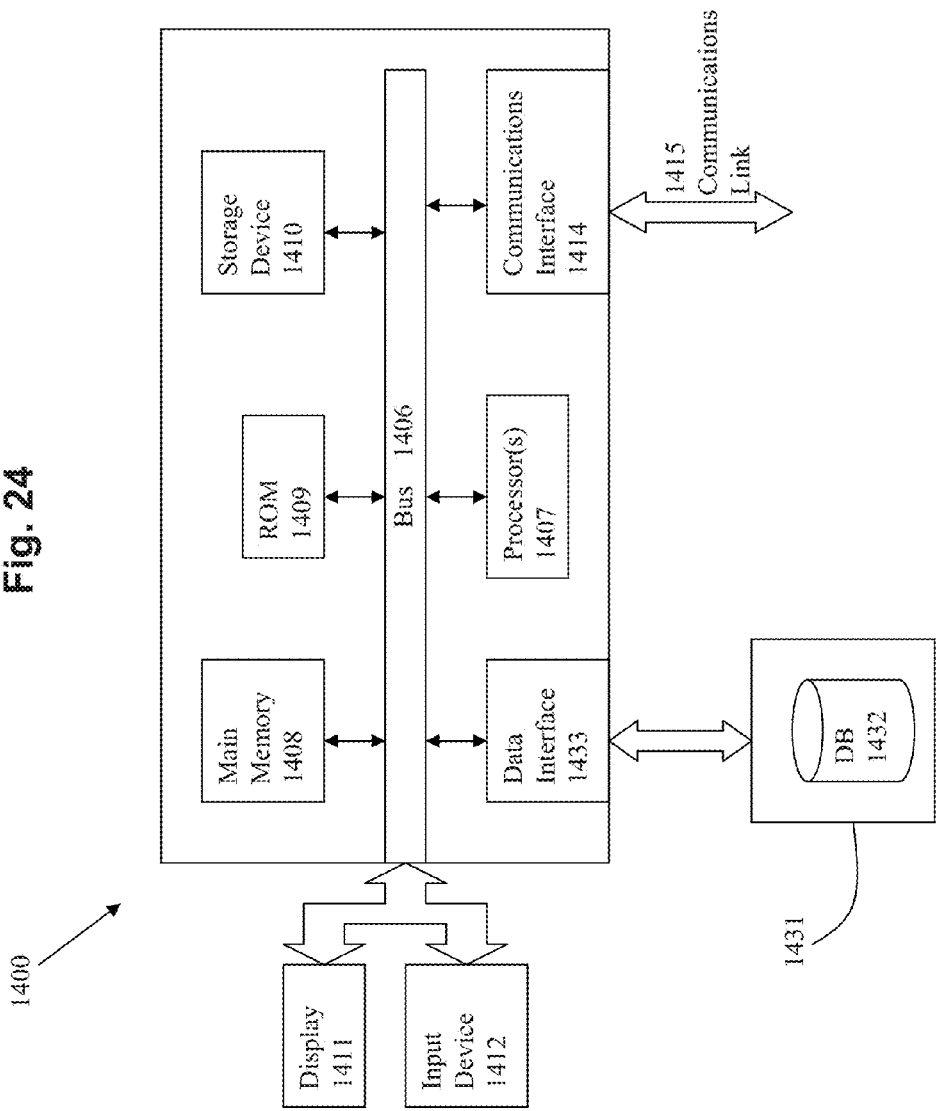
FIG. 24 illustrates an example computing architecture with which embodiments of the invention may be practiced.

FIG. 24 is a block diagram of an illustrative computing system 1400 suitable for implementing an embodiment of the present invention, e.g., to implement some or all of the components of the system of FIG. 5 such as user station 524 or EDA tools 540. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. In some embodiments, the computer system 1400 operates in conjunction with a data storage system 1431 that contains a database (DB) 1432 that is accessible by the computer system 1400. The computer system 1400 communicates with the data storage system 1431 through a data interface 1433. A data interface 1433, which is coupled to the bus 1406, transmits and receives various signals.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

The invention claimed is:

1. A computer-implemented method for interfacing a complex hardware description language model with an analog simulation model for simulation that is executable by a computer processor, comprising:
    identifying a first design portion comprising a complex hardware description language model in a hardware description language;
    identifying a second design portion comprising an analog simulation model, wherein the analog simulation model is created in an analog simulation language that does not directly correspond to a complex type in the hardware description language associated with the complex hardware description language model of the first design portion of an electronic circuit design;
    creating a dummy cell in the hardware description language that is instantiated to include a first conversion element corresponding to the complex hardware description language model, wherein the first conversion element is of a type that is determined to receive priority for conversion element selection based at least in part upon prioritization; and
    modifying the analog simulation model to include a second conversion element to interface with the complex hardware description language model to perform analog simulation with a modified analog simulation model for the electronic circuit design by using an analog simulator.

2. The method of claim 1, in which the hardware description language comprises VHDL and the analog simulation language comprises SPICE.

3. The method of claim 1, in which the complex hardware description language model comprises a combination of different parameter types.

4. The method of claim 1, in which the complex hardware description language model comprises a complex real number model.

5. The method of claim 1, in which the first conversion element and the second conversion element are stored in a configuration element library, and are selected based upon configuration information.

6. The method of claim 1, in which the first conversion element in the dummy cell converts a digital interface in the complex hardware description language model to an analog value.

7. The method of claim 1, in which the dummy cell comprises a set of attributes regarding the analog simulation model.

8. The method of claim 1, in which tolerance levels are configured for conversion elements.

9. The method of claim 1, in which multiple pins are addressed with a signal conversion element.

10. The method of claim 1, further comprising applying the prioritization to determine the type that receives the priority for the conversion element selection.

11. The method of claim 1, in which an optimization is performed to select an appropriate number of conversion elements.

12. The method of claim 11, in which coercion is performed to coerce signals from a real type to an analog type so that a conversion element is not inserted between two analog blocks.

13. The method of claim 11, in which a common conversion element is utilized for multiple design blocks.

14. The method of claim 1, in which conversion elements are selected based upon a process, comprising:
    locating a connection between the complex hardware description language model in a hardware description language and the analog simulation model in the analog simulation language;
    obtaining information regarding the connection and blocks for conversion element selection;
    matching to one or more of the conversion elements in a conversion element library; and
    instantiating selected ones of the conversion elements.

15. A computer program product that includes a non-transitory computer readable medium, the non-transitory computer readable medium comprising a plurality of computer instructions which, when executed by a computer processor, cause the processor to execute a process for interfacing a complex hardware description language model with an analog simulation model for simulation that is executable by a computer processor, the process comprising:
    identifying a first design portion comprising a complex hardware description language model in a hardware description language;
    identifying a second design portion comprising an analog simulation model, wherein the analog simulation model is created in an analog simulation language that does not directly correspond to a complex type in the hardware description language associated with the complex hardware description language model of the first design portion of an electronic circuit design;
    creating a dummy cell in the hardware description language that is instantiated to include a first conversion element corresponding to the complex hardware description language model, wherein the first conversion element is of a type that is determined to receive priority for conversion element selection based at least in part upon prioritization; and
    modifying the analog simulation model to include a second conversion element to interface with the complex hardware description language model to perform analog simulation with a modified analog simulation model for the electronic circuit design by using an analog simulator.

16. The computer program product of claim 15, in which the hardware description language comprises VHDL and the analog simulation language comprises SPICE.

17. The computer program product of claim 15, in which the complex hardware description language model comprises a combination of different parameter types.

18. The computer program product of claim 15, in which the complex hardware description language model comprises a complex real number model.

19. The computer program product of claim 15, in which the first conversion element and the second conversion element are stored in a configuration element library, and are selected based upon configuration information.

20. The computer program product of claim 15, in which the first conversion element in the dummy cell converts a digital interface in the complex hardware description language model to an analog value.

21. The computer program product of claim 15, in which the dummy cell comprises a set of attributes regarding the analog simulation model.

22. The computer program product of claim 15, in which tolerance levels are configured for conversion elements.

23. The computer program product of claim 15, in which multiple pins are addressed with a signal conversion element.

24. The computer program product of claim 15, the process further comprising applying the prioritization to determine the type that receives the priority for the conversion element selection.

25. The computer program product of claim 15, in which an optimization is performed to select an appropriate number of conversion elements.

26. The computer program product of claim 15, in which conversion elements are selected based upon a process, comprising:
locating a connection between the complex hardware description language model in a hardware description language and the analog simulation model in the analog simulation language;
obtaining information regarding the connection and blocks for conversion element selection;
matching to one or more of the conversion elements in a conversion element library; and
instantiating selected ones of the conversion elements.

27. A system for interfacing a complex hardware description language model with an analog simulation model for simulation that is executable by a computer processor, comprising:
a processor;
a memory for holding programmable code, wherein the programmable code includes instructions which, when executed by the processor, cause the processor to at least:
identify a first design portion comprising a complex hardware description language model in a hardware description language;
identify a second design portion comprising an analog simulation model, wherein the analog simulation model is created in an analog simulation language that does not directly correspond to a complex type in the hardware description language associated with the complex hardware description language model of the first design portion of an electronic circuit design;
create a dummy cell in the hardware description language that is instantiated to include a first conversion element corresponding to the complex hardware description language model, wherein the first conversion element is of a type that is determined to receive priority for conversion element selection based at least in part upon prioritization; and
modify the analog simulation model to include a second conversion element to interface with the complex hardware description language model to perform analog simulation with a modified analog simulation model for the electronic circuit design by using an analog simulator.

28. The system of claim 27, in which the hardware description language comprises VHDL and the analog simulation language comprises SPICE.

29. The system of claim 27, in which the complex hardware description language model comprises a combination of different parameter types.

30. The system of claim 27, in which the complex hardware description language model comprises a complex real number model.

31. The system of claim 27, in which the first conversion element and the second conversion element are stored in a configuration element library, and are selected based upon configuration information.

32. The system of claim 27, in which the first conversion element in the dummy cell converts a digital interface in the complex hardware description language model to an analog value.

33. The system of claim 27, in which the dummy cell comprises a set of attributes regarding the analog simulation model.

34. The system of claim 27, in which tolerance levels are configured for the first conversion element and the second conversion elements.

35. The system of claim 27, in which multiple pins are addressed with a signal conversion element.

36. The system of claim 27, in which the prioritization is applied to determine the type that receives the priority for the conversion element selection.

37. The system of claim 27, in which an optimization is performed to select an appropriate number of conversion elements.

38. The system of claim 27, in which conversion elements are selected based upon a process, comprising:
locating a connection between the complex hardware description language model in a hardware description language and the analog simulation model in the analog simulation language;
obtaining information regarding the connection and blocks for conversion element selection;
matching to one or more of the conversion elements in a conversion element library; and
instantiating selected ones of the conversion elements.

* * * * *